(12) United States Patent
Groothuis et al.

(10) Patent No.: US 11,594,462 B2
(45) Date of Patent: Feb. 28, 2023

(54) STACKED SEMICONDUCTOR DIE ASSEMBLIES WITH MULTIPLE THERMAL PATHS AND ASSOCIATED SYSTEMS AND METHODS

(71) Applicant: Micron Technology, Inc., Boise, ID (US)

(72) Inventors: Steven K. Groothuis, Boise, ID (US); Jian Li, Boise, ID (US); Haojun Zhang, Clay, NY (US); Paul A. Silvestri, Chandler, AZ (US); Xiao Li, Boise, ID (US); Shijian Luo, Boise, ID (US); Luke G. England, Urbandale, IA (US); Brent Keeth, Boise, ID (US); Jaspreet S. Gandhi, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/936,639

(22) Filed: Jul. 23, 2020

(65) Prior Publication Data
US 2020/0350224 A1    Nov. 5, 2020

Related U.S. Application Data

(60) Continuation of application No. 16/229,257, filed on Dec. 21, 2018, now Pat. No. 10,741,468, which is a
(Continued)

(51) Int. Cl.
*H01L 23/36* (2006.01)
*H01L 23/367* (2006.01)
(Continued)

(52) U.S. Cl.
CPC .......... *H01L 23/36* (2013.01); *H01L 23/3675* (2013.01); *H01L 23/3677* (2013.01);
(Continued)

(58) Field of Classification Search
CPC . H01L 23/36; H01L 23/3675; H01L 23/3736; H01L 23/42; H01L 23/3677; H01L 25/0657; H01L 25/18
See application file for complete search history.

(56) References Cited

U.S. PATENT DOCUMENTS

| 5,536,907 A | 7/1996 | Miyawaki et al. |
| 5,789,810 A | 8/1998 | Gross et al. |

(Continued)

FOREIGN PATENT DOCUMENTS

| JP | 2005217205 A | 8/2005 |
| JP | 2006210892 A | 8/2006 |

(Continued)

OTHER PUBLICATIONS

European Search Report dated Jun. 8, 2015 in European Application No. 12849421.8, 6 pages.

(Continued)

*Primary Examiner* — Aaron J Gray
(74) *Attorney, Agent, or Firm* — Perkins Coie LLP

(57) ABSTRACT

Stacked semiconductor die assemblies with multiple thermal paths and associated systems and methods are disclosed herein. In one embodiment, a semiconductor die assembly can include a plurality of first semiconductor dies arranged in a stack and a second semiconductor die carrying the first semiconductor dies. The second semiconductor die can include a peripheral portion that extends laterally outward beyond at least one side of the first semiconductor dies. The semiconductor die assembly can further include a thermal transfer feature at the peripheral portion of the second semiconductor die. The first semiconductor dies can define a first thermal path, and the thermal transfer feature can define a second thermal path separate from the first semiconductor dies.

15 Claims, 6 Drawing Sheets

Related U.S. Application Data continuation of application No. 14/825,009, filed on Aug. 12, 2015, now Pat. No. 10,170,389, which is a division of application No. 13/613,540, filed on Sep. 13, 2012, now Pat. No. 9,153,520.

(60) Provisional application No. 61/559,659, filed on Nov. 14, 2011, provisional application No. 61/559,664, filed on Nov. 14, 2011.

(51) Int. Cl.
*H01L 23/373* (2006.01)
*H01L 23/42* (2006.01)
*H01L 25/065* (2006.01)
*H01L 25/18* (2006.01)
*H01L 25/00* (2006.01)

(52) U.S. Cl.
CPC .......... *H01L 23/3736* (2013.01); *H01L 23/42* (2013.01); *H01L 25/0657* (2013.01); *H01L 25/18* (2013.01); *H01L 25/50* (2013.01); *H01L 2224/16145* (2013.01); *H01L 2224/16227* (2013.01); *H01L 2224/17181* (2013.01); *H01L 2224/73204* (2013.01); *H01L 2225/06513* (2013.01); *H01L 2225/06544* (2013.01); *H01L 2225/06589* (2013.01); *H01L 2924/15311* (2013.01)

(56) References Cited

U.S. PATENT DOCUMENTS

| | | | |
|---|---|---|---|
| 6,111,313 | A | 8/2000 | Kutlu |
| 6,316,786 | B1 | 11/2001 | Mueller et al. |
| 6,320,257 | B1 | 11/2001 | Jayaraj et al. |
| 6,458,609 | B1 | 10/2002 | Hikita et al. |
| 6,462,410 | B1 | 10/2002 | Novotny et al. |
| 6,637,506 | B2 | 10/2003 | Gektin et al. |
| 6,649,443 | B2 | 11/2003 | Gektin |
| 6,853,068 | B1 | 2/2005 | Djekic |
| 6,906,413 | B2 | 6/2005 | Bish et al. |
| 7,119,433 | B2 | 10/2006 | Corbin et al. |
| 7,186,590 | B2 | 3/2007 | Alcoe et al. |
| 7,239,020 | B2 | 7/2007 | Morkner |
| 7,268,020 | B2 | 9/2007 | Vogt |
| 7,273,090 | B2 | 9/2007 | Crocker et al. |
| 7,352,068 | B2 | 4/2008 | Kuroda et al. |
| 7,506,527 | B2 | 3/2009 | Anderson |
| 7,518,219 | B2 | 4/2009 | Bish et al. |
| 7,541,217 | B1 | 6/2009 | Chang et al. |
| 7,547,582 | B2 | 6/2009 | Brunschwiler et al. |
| 7,781,883 | B2 | 8/2010 | Sri-Jayantha et al. |
| 7,928,562 | B2 | 4/2011 | Arvelo et al. |
| 7,939,364 | B2 | 5/2011 | Gektin et al. |
| 7,964,951 | B2 | 6/2011 | Refai-Ahmed |
| 9,153,520 | B2 * | 10/2015 | Groothuis ........... H01L 25/0657 |
| 2003/0057540 | A1 | 3/2003 | Shieh |
| 2004/0042178 | A1 | 3/2004 | Gektin et al. |
| 2004/0074630 | A1 | 4/2004 | Sen et al. |
| 2004/0238944 | A1 | 12/2004 | Bish et al. |
| 2004/0262372 | A1 | 12/2004 | Houle et al. |
| 2005/0170600 | A1 | 8/2005 | Fukuzo |
| 2006/0044773 | A1 | 3/2006 | Akram et al. |
| 2006/0261467 | A1 | 11/2006 | Colgan et al. |
| 2007/0023887 | A1 | 2/2007 | Matsui |
| 2007/0145571 | A1 | 6/2007 | Lee et al. |
| 2008/0001277 | A1 | 1/2008 | Wen et al. |
| 2008/0042261 | A1 | 2/2008 | Wolter et al. |
| 2008/0083975 | A1 * | 4/2008 | Chao ....................... H01L 24/97 257/E21.705 |
| 2008/0099909 | A1 | 5/2008 | Baek et al. |
| 2008/0122067 | A1 | 5/2008 | Wang |
| 2009/0057880 | A1 | 3/2009 | Baek et al. |
| 2009/0161402 | A1 | 6/2009 | Oh et al. |
| 2009/0224400 | A1 * | 9/2009 | Rahman ............. H01L 25/0652 257/E23.101 |
| 2009/0267194 | A1 | 10/2009 | Chen |
| 2010/0019377 | A1 * | 1/2010 | Arvelo .................. H01L 21/563 257/E23.101 |
| 2010/0044856 | A1 | 2/2010 | Sri-Jayantha et al. |
| 2010/0078790 | A1 | 4/2010 | Ito et al. |
| 2010/0078807 | A1 | 4/2010 | Schulz |
| 2010/0095168 | A1 | 4/2010 | Jeddeloh |
| 2010/0187670 | A1 | 7/2010 | Lin et al. |
| 2010/0230805 | A1 | 9/2010 | Refai-Ahmed et al. |
| 2010/0315787 | A1 | 12/2010 | Li et al. |
| 2010/0320588 | A1 | 12/2010 | Dahilig et al. |
| 2012/0007229 | A1 * | 1/2012 | Bartley ............... H01L 23/3677 438/122 |
| 2012/0038057 | A1 * | 2/2012 | Bartley ................... H01L 23/50 257/E23.174 |
| 2012/0205792 | A1 | 8/2012 | Sugaya et al. |
| 2013/0119527 | A1 | 5/2013 | Luo et al. |
| 2013/0119528 | A1 | 5/2013 | Groothuis et al. |
| 2019/0122950 | A1 | 4/2019 | Groothuis et al. |

FOREIGN PATENT DOCUMENTS

| | | |
|---|---|---|
| JP | 2008091879 A | 4/2008 |
| JP | 2009277334 A | 11/2009 |
| JP | 2010103195 A | 5/2010 |
| JP | 2010251427 A | 11/2010 |
| KR | 0874910 | 12/2008 |
| KR | 20110037066 A | 4/2011 |
| TW | 200839978 A | 10/2008 |
| TW | I331383 B | 10/2010 |
| WO | 2008108335 A1 | 9/2008 |

OTHER PUBLICATIONS

Office Action dated May 5, 2016 in China Application No. 201280061833.8, 30 pages.
International Search Report and Written Opinion dated Mar. 12, 2013 in International Application No. PCT/US2012/064672, 7 pages.
Office Action dated Apr. 20, 2016 in Korea Application No. 10-2014-7015990, 7 pages.
Office Action dated Dec. 22, 2015 in Japan Application No. 2014-541369, 10 pages.
Office Action dated Jul. 26, 2016 in Japan Application No. 2014-541369, 9 pages.
Office Action dated Oct. 7, 2015 in Korea Application No. 2014-7015990, 12 pages.
Sikka, K. et al., "An Efficient Lid Design for Cooling Stacked Flip-chip 3D Packages, Thermal and Thermomechanical Phenomena in Electronic Systems (ITherm)", 2012 13th IEEE Intersociety Conference on, pp. 606-611, May 30, 2012-Jun. 1, 2012. DOI: 10.1109/IT.

* cited by examiner

STACKED SEMICONDUCTOR DIE ASSEMBLIES WITH MULTIPLE THERMAL PATHS AND ASSOCIATED SYSTEMS AND METHODS

CROSS-REFERENCE TO RELATED APPLICATIONS

This application is a continuation of U.S. application Ser. No. 16/229,257, filed Dec. 21, 2018, which is a continuation of U.S. application Ser. No. 14/825,009, filed Aug. 12, 2015, now U.S. Pat. No. 10,170,389; which is a divisional of U.S. application Ser. No. 13/613,540, filed Sep. 13, 2012, now U.S. Pat. No. 9,153,520; which claims priority to U.S. Provisional Application No. 61/559,659, filed Nov. 14, 2011; and U.S. Provisional Application No. 61/559,664, filed Nov. 14, 2011, each of which is incorporated herein by reference in its entirety. This application is directed to subject matter related to that disclosed in U.S. application Ser. No. 13/613,235, filed Sep. 13, 2012, which is commonly owned, and which is incorporated herein by reference in its entirety.

TECHNICAL FIELD

The disclosed embodiments relate to semiconductor die assemblies. In particular, the present technology relates to stacked semiconductor die assemblies with multiple thermal paths and associated systems and methods.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Market pressures continually drive semiconductor manufacturers to reduce the size of die packages to fit within the space constraints of electronic devices, while also pressuring them to increase the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

A challenge associated with vertically stacked die packages is that the heat generated by the individual dies combines and increases the operating temperatures of the individual dies, the junctions therebetween, and the package as a whole. This can cause the stacked dies to reach temperatures above their maximum operating temperatures ($T_{max}$), especially as the density of the dies in the package increases.

DETAILED DESCRIPTION

Specific details of several embodiments of stacked semiconductor die assemblies with multiple thermal paths and associated systems and methods are described below. The term "semiconductor die" generally refers to a die having integrated circuits or components, data storage elements, processing components, and/or other features manufactured on semiconductor substrates. For example, semiconductor dies can include integrated circuit memory and/or logic circuitry. Semiconductor dies and/or other features in semiconductor die packages can be said to be in "thermal contact" with one another if the two structures can exchange energy through heat. A person skilled in the relevant art will also understand that the technology may have additional embodiments, and that the technology may be practiced without several of the details of the embodiments described below with reference to FIGS. 1-8.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
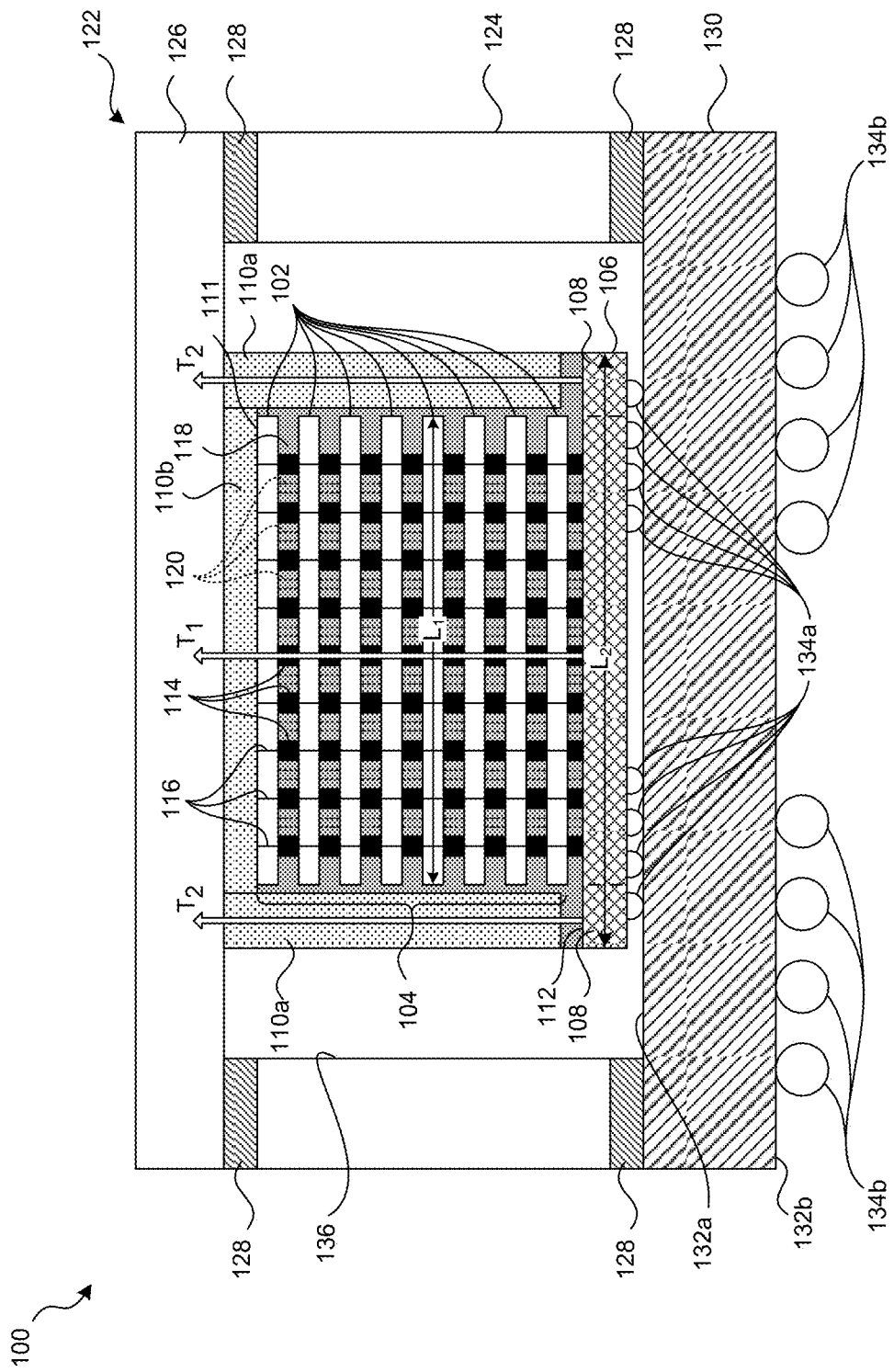
FIG. 1 is a cross-sectional view of a semiconductor die assembly configured in accordance with embodiments of the present technology.

FIG. 1 is a cross-sectional view of a semiconductor die assembly 100 ("assembly 100") configured in accordance with embodiments of the present technology. The assembly 100 can include one or a plurality of first semiconductor dies 102 arranged in a stack 104 on a second semiconductor die 106 and carried by a package substrate 130. As shown in FIG. 1, the second semiconductor die 106 can have a larger footprint than the stacked first semiconductor dies 102. The second semiconductor die 106, therefore, includes a peripheral portion 108 extending laterally outward beyond at least one side of the first semiconductor dies 102 (e.g., beyond the length and/or width of the first semiconductor dies 102). The assembly 100 can further include a first thermal transfer feature 110a at the peripheral portion 108 of the second semiconductor die 106 and an optional second thermal transfer feature 110b superimposed with the first semiconductor dies 102. During operation, thermal energy can flow away from the second semiconductor die 106 through the first semiconductor dies 102 via a first thermal path (e.g., as illustrated by arrow $T_1$) and through the first thermal transfer feature 110a via a second thermal path (e.g., illustrated by arrows $T_2$) separate from the first thermal path $T_1$. The second thermal path $T_2$ of the embodiment shown in FIG. 1 is accordingly spaced laterally apart from the perimeter edges of the first semiconductor dies 102.

The first and second semiconductor dies 102 and 106 (collectively referred to as "dies 102, 106") can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, for example, the assembly 100 can be configured as a hybrid memory cube (HMC) in which the stacked first semiconductor dies 102 are DRAM dies or other memory dies that provide data storage and the second semiconductor die 106 is a high-speed logic die that provides memory control (e.g., DRAM control) within the HMC. In other embodiments, the first and second semiconductor dies 102 and 106 may include other semiconductor components and/or the semiconductor components of the individual first semiconductor dies 102 in the stack 104 may differ.

The dies 102, 106 can be rectangular, circular, and/or other suitable shapes and may have various different dimensions. For example, the individual first semiconductor dies 102 can each have a length $L_1$ of about 10-11 mm (e.g., 10.7 mm) and a width of about 8-9 mm (e.g., 8.6 mm, 8.7 mm). The second semiconductor die 106 can have a length $L_2$ of about 12-13 mm (e.g., 12.67 mm) and a width of about 8-9 mm (e.g., 8.5 mm, 8.6 mm, etc.). In other embodiments, the first and second semiconductor dies 102 and 106 can have other suitable dimensions and/or the individual first semiconductor dies 102 may have different dimensions from one another.

The peripheral portion 108 (known to those skilled in the art as a "porch" or "shelf") of the second semiconductor die 106 can be defined by the relative dimensions of the first and second semiconductor dies 102 and 106 and the position of the stack 104 on a forward-facing surface 112 of the second semiconductor die 106. In the embodiment illustrated in FIG. 1, the stack 104 is centered with respect to the length $L_2$ of the second semiconductor die 106 such that the peripheral portion 108 extends laterally beyond two opposite sides of the stack 104. For example, if the length $L_2$ of the second semiconductor die 106 is about 1.0 mm greater than the length $L_1$ of the first semiconductor dies 102, the peripheral portion 108 will extend about 0.5 mm beyond either side of the centered first semiconductor dies 102. The stack 104 may also be centered with respect to the width of the second semiconductor die 106 and, in embodiments where both the width and length of the second semiconductor die 106 are greater than those of the centered stack 104, the peripheral portion 108 may extend around the entire perimeter of the first semiconductor dies 102. In other embodiments, the stack 104 may be offset with respect to the forward-facing surface 112 of the second semiconductor die 106 and/or the peripheral portion 108 of the second semiconductor die 106 may extend around less than the full perimeter of the stack 104, in further embodiments, the first and second semiconductor dies 102 and 106 can be circular, and therefore the relative diameters of the first and second semiconductor dies 102 and 106 define the peripheral portion 108.

As shown in FIG. 1, the first semiconductor dies 102 can be electrically coupled to one another in the stack 104 and to the underlying second semiconductor die 106 by a plurality of electrically conductive elements 114 positioned between adjacent dies 102, 106. Although the stack 104 shown in FIG. 1 includes eight first semiconductor dies 102 electrically coupled together, in other embodiments the stack 104 can include fewer than eight dies (e.g., three dies, four dies, etc.) or more than eight dies (e.g., ten dies, twelve dies, etc.). The electrically conductive elements 114 can have various suitable structures, such as pillars, columns, studs, bumps, and can be made from copper, nickel, solder (e.g., SnAg-based solder), conductor-filled epoxy, and/or other electrically conductive materials. In selected embodiments, for example, the electrically conductive elements 114 can be copper pillars, whereas in other embodiments the electrically conductive elements 114 can include more complex structures, such as bump-on-nitride structures.

As further shown in FIG. 1, the individual first semiconductor dies 102 can each include a plurality of TSVs 116 aligned on one or both sides with corresponding electrically conductive elements 114 to provide electrical connections at opposing sides of the first semiconductor dies 102. Each TSV 116 can include an electrically conductive material (e.g., copper) that passes completely through the individual first semiconductor dies 102 and an electrically insulative material surrounding the electrically conductive material to electrically isolate the TSVs 116 from the remainder of the die 102. Though not shown in FIG. 1, the second semiconductor die 106 can also include a plurality of TSVs 116 to electrically couple the second semiconductor die 106 to higher level circuitry. Beyond electrical communication, the TSVs 116 and the electrically conductive elements 114 can serve as thermal conduits through which heat can be transferred away from the first and second semiconductor dies 102 and 106 (e.g., through the first thermal path $T_1$). In some embodiments, the dimensions of the electrically conductive elements 114 and/or the TSVs 116 can be increased to enhance thermal contact conductance of the stack 104. For example, the individual electrically conductive elements 114 can each have a diameter of about 15-30 μm or other suitable dimensions to enhance the thermal path away from the dies 102, 106. In other embodiments, the first semiconductor dies 102 can be electrically coupled to one another and to the second semiconductor die 106 using other types of electrical connectors (e.g., wirebonds) that may also serve as thermal pathways through the stack 104.

A dielectric underfill material 118 can be deposited or otherwise formed around and/or between the first and second semiconductor dies 102 and 106 to electrically isolate the electrically conductive elements 114 and/or enhance the mechanical connection between the semiconductor dies 102, 106. The underfill material 118 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. In some embodiments, the underfill material 118 can be selected based on its thermal conductivity to enhance heat dissipation through the stack 104.

In various embodiments, the assembly 100 may also include a plurality of thermally conductive elements 120 (shown in broken lines) positioned interstitially between the electrically conductive elements 114. The individual thermally conductive elements 120 can be at least generally similar in structure and composition as that of the electrically conductive elements 114 (e.g., copper pillars). However, the thermally conductive elements 120 are not electrically coupled to the TSVs 116, and therefore do not provide electrical connections between the first semiconductor dies 102. Instead, the thermally conductive elements 120 serve to increase the overall thermal conductivity of the stack 104, thereby facilitating heat transfer through the stack 104 (e.g., along the first thermal path $T_1$). For example, in embodiments where the assembly 100 is configured as a HMC, the addition of the thermally conductive elements 120 between the electrically conductive elements 114 has been shown to decrease the operating temperature of the HMC by several degrees (e.g., about 6-7° C.).

As shown in FIG. 1, the package substrate 130 can provide the dies 102, 106 with electrical connections to external electrical components (e.g., higher-level packaging; not shown). For example, the package substrate 130 can be an interposer or printed circuit board that includes semiconductor components (e.g., doped silicon wafers or gallium arsenide wafers), non-conductive components (e.g., various ceramic substrates, such as aluminum oxide ($Al_2O_3$), aluminum nitride (AlN), etc.), and/or conductive portions (e.g., interconnecting circuitry, TSVs, etc.). In the embodiment illustrated in FIG. 1, the package substrate 130 is electrically coupled to the second semiconductor die 106 at a first side 132a of the package substrate 130 via a first plurality of electrical connectors 134a and to external circuitry (not shown) at a second side 132b of the package substrate 130 via a second plurality of electrical connectors 134b (collectively referred to as "the electrical connectors 134"). The electrical connectors 134 can be solder balls, conductive bumps and pillars, conductive epoxies, and/or other suitable electrically conductive elements. A dielectric underfill (e.g., FP4585 manufactured by Henkel of Düsseldorf, Germany; not shown) can be spaced between the second semiconductor die 106 and the package substrate 130 for enhanced mechanical connection and electrical isolation of the first plurality of electrical connectors 134a. In various embodiments, the package substrate 130 can be made from a material with a relatively high thermal conductivity to enhance heat dissipation at the back side of the second semiconductor die 106.

As discussed above, the first thermal transfer feature 110a can thermally contact the peripheral portion 108 of the second semiconductor die 106 to remove heat along the second thermal path $T_2$, and the second thermal transfer feature 110b can thermally contact the uppermost die 102 in the stack 104 to remove heat along the first thermal path $T_1$. In the embodiment illustrated in FIG. 1, the first thermal transfer feature 110a has a pillar-like structure that extends vertically from the peripheral portion 108 to an elevation generally corresponding to that of the outermost die 102 in the stack 104 to define a substantially vertical thermal path from which heat can be removed from the peripheral portion 108. As shown in FIG. 1, the underfill material 118 and/or other thermally transmissive materials may be spaced between the first thermal transfer feature 110a and the peripheral portion 108 (e.g., for adhesive purposes). In other embodiments, the first thermal transfer feature 110a can extend vertically a lesser or greater elevation with respect to the elevation of the stacked first semiconductor dies 102 to define other vertical thermal paths. As described in greater detail below, in other embodiments the first thermal transfer feature 110a can have different configurations and may define thermal paths that transfer heat laterally outward (i.e., rather than vertically away) from the peripheral portion 108.

In the illustrated embodiment, the second thermal transfer feature 110b extends across a forward-facing surface 111 of the first semiconductor die 102 spaced furthest from the second semiconductor die 106 (e.g., the uppermost die 102 in the stack 104). The second thermal transfer feature 110b can therefore absorb heat directly from the stack 104 (e.g., through the electrically conductive elements 114 and TSVs 116) and transfer it away from the dies 102, 106. In other embodiments, the second thermal transfer element 110b can have other suitable configurations, and/or the first and second thermal transfer elements 110a and 110b can be an integral structure formed on the peripheral portion 108 and over the stack 104. In further embodiments, the second thermal transfer feature 110a can be omitted.

The thermal transfer features 110 can be made from materials with relatively high thermal conductivities to increase the thermal conductance of heat away from the dies 102, 106, For example, the first thermal transfer feature 110a can be made from blank silicon, which can have a thermal conductivity dependent on temperature (e.g., about 149 W/m° K at 25° C. and/or about 105 W/m° K at 100° C.). In other embodiments, the first and/or second thermal transfer features 110 can be made from what are known in the art as "thermal interface materials" or "TIMs", which are designed to increase the thermal contact conductance at surface junctions (e.g., between a die surface and a heat spreader). TIMs can include silicone-based greases, gels, or adhesives that are doped with conductive materials (e.g., carbon nanotubes, solder materials, diamond-like carbon (DLC), etc.), as well as phase-change materials. In some embodiments, for example, the second thermal transfer feature Hob can be made from X-23-7772-4 TIM manufactured by Shin-Etsu MicroSi, Inc. of Phoenix, Ariz., which has a thermal conductivity of about 3-4 W/m° K. In other embodiments, the thermal transfer features 110 can be made from metals (e.g., copper) and/or other suitable thermally conductive materials.

In various embodiments, the thermal transfer features 110 can be pre-formed members (e.g., pads, pillars, and/or other suitable structures) that can be attached to the peripheral portion 108 of the second semiconductor die 106 and/or superimposed with the first semiconductor dies 102 (e.g., via a thermally transmissive adhesive, curing, etc.). In other embodiments, the thermal transfer features 110 may be deposited or otherwise formed on the forward-facing surface 112 of the peripheral portion 108 and/or on the forward-facing surface 111 of the stack 104 using formation methods known to those in the art, such as chemical vapor deposition (CVD) and physical vapor deposition (PVD).

As shown in FIG. 1, the first and second thermal transfer features 110a and 110b can thermally contact a thermally conductive casing 122 ("casing 122") that extends at least partially around the first and second semiconductor dies 102 and 106. The casing 122 can include an outer portion 124 spaced laterally apart from the second semiconductor die 106 on the package substrate 130 and a cap portion 126 carried by the outer portion 124. In the illustrated embodiment, the outer portion 124 and the cap portion 126 form a recess 136 configured such that both the vertically-extending first thermal transfer feature 110a and the second thermal transfer feature 110b thermally contact an underside of the cap portion 126. In other embodiments, however, the casing 122 and/or the thermal transfer features 110 can have other suitable configurations such that the thermal transfer features 110 thermally contact other portions of the casing 122.

The casing 122 can serve as a heat spreader to absorb and dissipate the heat from the first and second thermal paths $T_1$ and $T_2$. The casing 122 can accordingly be made from a thermally conductive material, such as nickel, copper, aluminum, ceramic materials with high thermal conductivities (e.g., aluminum nitride), and/or other suitable thermally conductive materials. As shown in FIG. 1, the outer portion 124 and the cap portion 126 can be joined together and to the underlying package substrate 130 using an adhesive 128. The adhesive 128 may be the same material as the underfill material 118, a TIM (e.g., the TIM used for thermal transfer features 110), another thermally transmissive adhesive, and/or other suitable adhesive materials. In other embodiments, the casing 122 can be formed integrally and/or have other suitable cross-sectional shapes. In various embodiments, the casing 122 may include a heat sink (not shown) with a plurality of fins and/or other surface enhancing structures for enhanced heat dissipation.

Several embodiments of the assembly 100 shown in FIG. 1 can provide enhanced thermal properties that lower the operating temperatures of the individual dies 102, 106 in the assembly 100 such that they stay below their designated maximum temperatures ($T_{max}$). In conventional stacked semiconductor die packages, the heat generated by the semiconductor dies is typically dispersed through a single thermal path provided by the die stack. Therefore, the heat generated at a peripheral portion of a larger underlying semiconductor die must travel laterally inward toward the die stack before being transferred vertically away from the underlying die. This extended thermal path results in a concentration of heat at the peripheral portion. In addition, when the assembly 100 is arranged as a HMC, the larger underlying logic die typically operates at a much higher power level than the memory dies stacked above it (e.g., 5.24 W compared to 0.628 W), and therefore the logic die generates a significant amount of heat that concentrates at the peripheral portion. The logic die may also have a higher power density at the peripheral portion, resulting in a further concentration of heat and temperature rise at the peripheral portion.

Figure 2A:
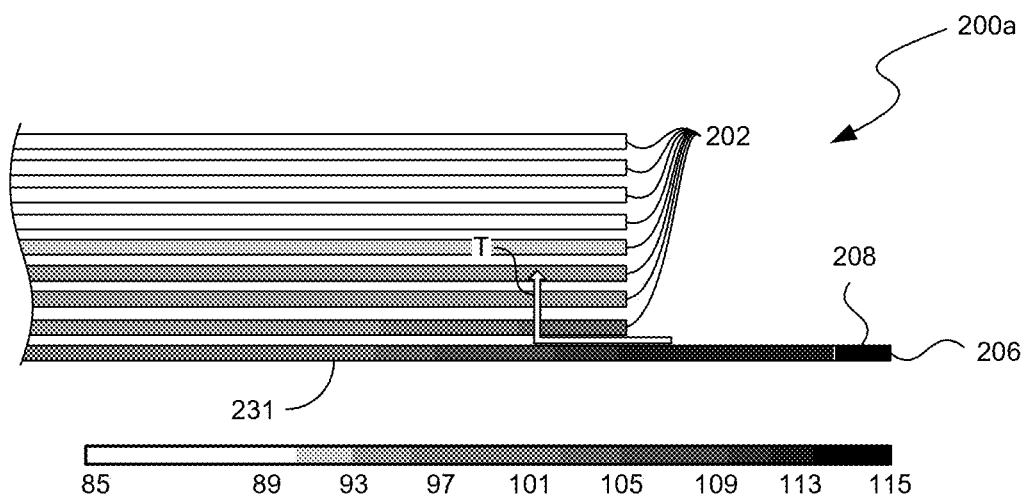
FIG. 2A is a schematic partial side view illustrating a temperature profile of a hybrid memory cube assembly without multiple thermal paths.

FIG. 2A, for example, is a schematic partial side view illustrating a temperature profile of a HMC assembly 200a with stacked memory dies 202 and an underlying logic die 206. As shown in FIG. 2A, thermal energy is removed from a peripheral portion 208 of the logic die 206 along a thermal path (illustrated by arrow T) that first extends laterally inward toward a medial portion 231 of the logic die 206 and then vertically through the stacked memory dies 202. During operation, this single thermal path and the high power density of the logic die 206 (especially at the peripheral portion 208) concentrate thermal energy at the peripheral portion 208. In the embodiment illustrated in FIG. 2A, for example, the operational temperature of the logic die 206 is at its highest (e.g., above 113° C.) at the peripheral portion 208 of the logic die 206, and may exceed the maximum operating temperature ($T_{max}$) of the logic die 206.

Figure 2B:
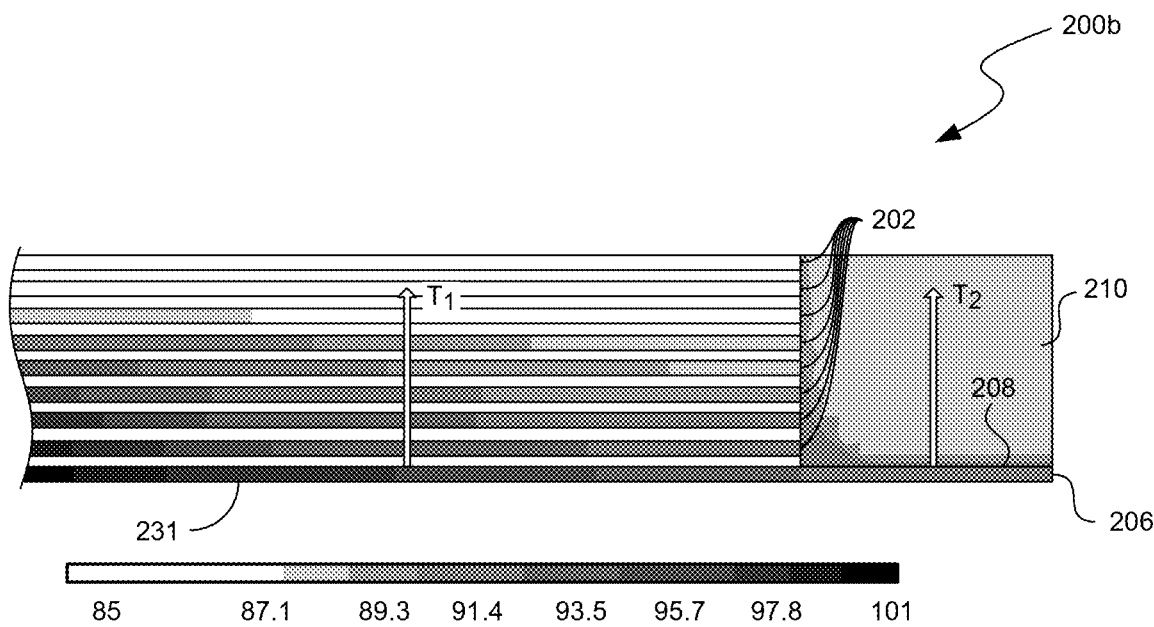
FIG. 2B is a schematic partial side view illustrating a temperature profile of a hybrid memory cube assembly configured in accordance with embodiments of the present technology.

The assembly 100 shown in FIG. 1 is expected to avoid the problems of other stacked semiconductor die packages by providing an additional thermal path at the peripheral portion 108 of the second semiconductor die 106, and thereby promotes heat dissipation directly away from the peripheral portion 108. FIG. 2B, for example, is a schematic partial side view illustrating a temperature profile of an HMC assembly 200b configured in accordance with the present technology. As shown in FIG. 2B, the stacked memory dies 202 provide a first thermal path (indicated by arrow $T_1$) that transfers heat vertically away from a medial portion 231 of the logic die 206, and a thermal transfer feature 210 provides a second thermal path (indicated by arrow $T_2$) spaced laterally apart from the stacked memory dies 202 that transfers heat vertically away from a peripheral portion 208 of the logic die 206. The addition of the separate second thermal path $T_2$, which is thermally isolated from the first thermal path $T_1$ at the logic die 206, can reduce the operational temperature at peripheral portion 208 of the logic die 206 (where the power density of the logic die 206 may be the highest), and the operating temperatures of the logic die 206 as a whole and/or the stacked memory dies 202 several degrees such that they can be maintained below their respective maximum operating temperatures ($T_{max}$. In the embodiment illustrated in FIG. 2B, for example, the addition of the second thermal path $T_2$ lowers the operating temperature at the peripheral portion 208 of the logic die 206 from over 113° C. (FIG. 2A) to less than 93° C., and lowers the maximum temperature seen by the logic die 206 from over 113° C. (FIG. 2A) to less than 100° C. (now moved to the medial portion 231). In addition, the overall change in temperature ($\Delta T$) across the logic die 206 may also be decreased (e.g., from about $\Delta T=19°$ C. to about $\Delta T=4.5°$ C.). The addition of the thermal transfer feature 210 at the peripheral portion 208 of the logic die 206 can accordingly reduce the overall temperature of the logic die 206 within an acceptable range and below maximum temperature specifications.

Figure 3:
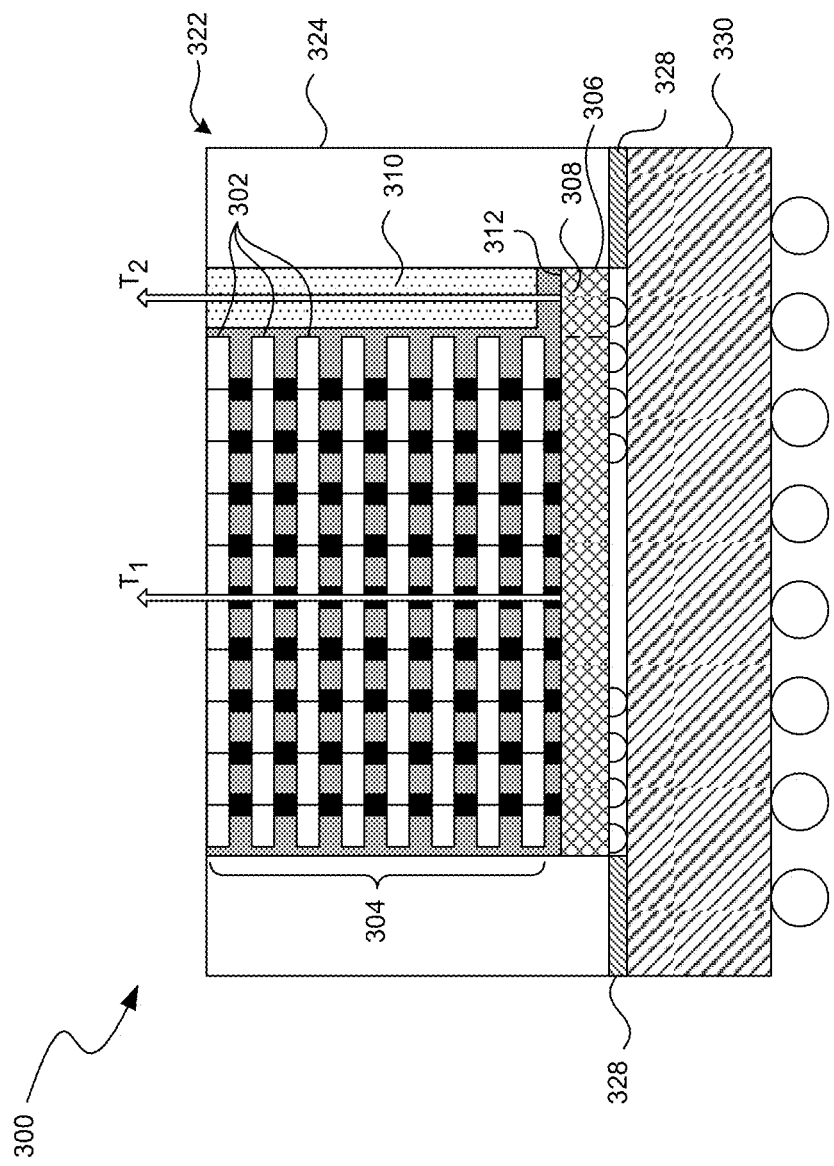
FIG. 3 is a cross-sectional view of a semiconductor die assembly configured in accordance with other embodiments of the present technology.

FIG. 3 is a cross-sectional view of a semiconductor die assembly 300 ("assembly 300") configured in accordance with other embodiments of the present technology. The assembly 300 can include features generally similar to the features of the assembly 100 described above with reference to FIG. 1. For example, the assembly 300 can include a plurality of first semiconductor dies 302 (e.g., memory dies) arranged in a stack 304 and a larger underlying second semiconductor die 306 (e.g., a high-speed logic die) carried by a package substrate 330. In the illustrated embodiment, the first semiconductor dies 302 are offset with respect to length on a forward-facing surface 312 of the second semiconductor die 306 such that a peripheral portion 308 of the second semiconductor die 306 extends laterally beyond one side of the first semiconductor dies 302 (e.g., a single side). A thermal transfer feature 310 extends vertically from the peripheral portion 308 to an elevation corresponding to that of the outermost die 302 in the stack 304. The assembly 300 can therefore include a first thermal path (indicated by arrow $T_1$) provided by the stack 304 and a second thermal path (indicated by arrow $T_2$) provided by the thermal transfer feature 310, and therefore allows heat to be removed vertically away from the peripheral portion 308 of the second semiconductor die 306. Though not shown in FIG. 3, the peripheral portion 308 may also extend beyond the width of the first semiconductor dies 302 (from one or both sides) with the thermal transfer feature 310 positioned thereon.

In the embodiment illustrated in FIG. 3, the assembly 300 further includes a thermally conductive casing 322 ("casing 322") attached to the package substrate 330 via an adhesive 328 (e.g., similar to the adhesive 128 of FIG. 1). Rather than extending over the first and second semiconductor dies 302 and 306, the casing 322 includes an outer portion 324 spaced laterally outward from the first and second semiconductor dies 302 and 306 and extending around the perimeter of the stacked semiconductor dies 302, 306. The casing 322 may be configured to dissipate heat laterally or radially outward from the semiconductor dies 302, 306 and vertically away from the assembly 300. In other embodiments, the casing 322 can include a thermally conductive cap (e.g., the cap portion 126 of FIG. 1) and/or a second thermal transfer feature (e.g., the second thermal transfer feature 110b of FIG. 1) that can be positioned on the stack 304 to further facilitate thermal energy transfer away from the stacked dies 302, 306.

Figure 4:
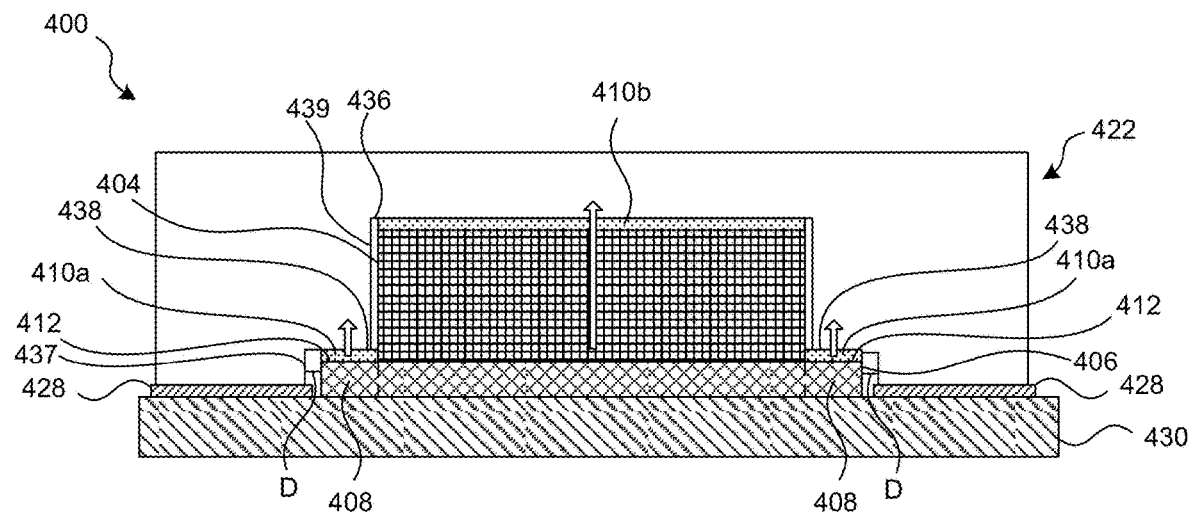
FIG. 4 is a partially schematic cross-sectional view of a semiconductor die assembly configured in accordance with further embodiments of the present technology.

FIG. 4 is a partially schematic cross-sectional view of a semiconductor die assembly 400 ("assembly 400") configured in accordance with further embodiments of the present technology. The assembly 400 can include features generally similar to the features of the assemblies 100, 300 shown in FIGS. 1 and 3. For example, the assembly 400 can include a stack 404 of first semiconductor dies (shown schematically), a larger underlying second semiconductor die 406, and a thermally conductive casing 422 ("casing 422") extending at least partially around the stack 404 and the second semiconductor die 406. The assembly 400 can also include a first thermal transfer feature 410a aligned with a peripheral portion 408 of the second semiconductor die 406 to facilitate thermal energy transfer directly from the peripheral portion 408 (e.g., rather than through the stack 404). Instead of extending vertically from the peripheral portion 408 to an elevation corresponding to the full height of the stack 404, the first thermal transfer feature 410a has a thickness (e.g., about 50 μm) such that the casing 422 interfaces with the first thermal transfer feature 410a proximate to the peripheral portion 408. For example, the first thermal transfer feature 410a can be a thin pre-formed tab or may be deposited as a thin layer on a forward-facing surface 412 of the peripheral portion 408. An optional second thermal transfer feature 410b can be spaced between the stack 404 and the casing 422 to facilitate heat transfer therebetween. In various embodiments, the first and second thermal transfer features 410a and 410b can have the same thickness, whereas in other embodiments their thicknesses may differ.

The casing 422 can be generally similar to the casing 122 described above with reference to FIG. 1. For example, the casing 422 can be made from a thermally conductive material (e.g., copper) and can be attached to an underlying package substrate 430 with an adhesive 428 (e.g., an adhesive TIM). However, as shown in FIG. 4, the casing 422 can include a cavity 436 that is configured to at least generally surround or encase the perimeter of the die stack 404 and the second semiconductor die 406. In the illustrated embodiment, for example, the cavity 436 includes a notched or stepped portion 438 that extends around the peripheral portion 408 of the second semiconductor die 406 and a main cavity portion 439 that receives the die stack 404. As shown in FIG. 4, the cavity 436 can also be configured such that the stepped portion 438 is spaced laterally outward from the second semiconductor die 406 on the package substrate 430 by a relatively small distance D (e.g., about 0.5 mm). This proximity to the second semiconductor die 406 can further enhance heat dissipation, as well as reduce the overall package size.

In various embodiments, the casing 422 can be made from a metal material and the cavity 436 can be formed by a plurality of metal coining steps known to persons skilled in the art. This allows the cavity 436 to be customized for the particular arrangement of the stacked dies 402, 406, and may facilitate thermal management of 3D integration (3DI) multi-die packages. In other embodiments, the casing 422 can be formed using other suitable casing formation methods known to those skilled in the art.

Unlike conventional thermally conductive casings, lids or caps that only contact the underlying device at the package substrate (e.g., through a polymeric adhesive or solder alloy) and at the top of the die stack, the multi-tiered cavity 436 shown in FIG. 4 allows the casing 422 to thermally contact the first thermal transfer feature 410a at the peripheral portion 408 of the second semiconductor die 406, the second thermal transfer feature 410b at the top of the stack 404, and the package substrate 430 proximate the peripheral portion 408. In various embodiments, for example, the casing 422 can overlap the peripheral portion 408 of the second semiconductor die 406 by about 0.4-0.5 mm on each side. This additional contact provides a greater surface area with which the casing 422 can transfer thermal energy and reduce the thermal resistance of the assembly 400. For example, the casing 422 with the cavity 436 has been shown to reduce the operating temperature at the peripheral portion 408 of a HMC assembly by about 3-5° C. or more (e.g., 10° C.).

Figure 5:
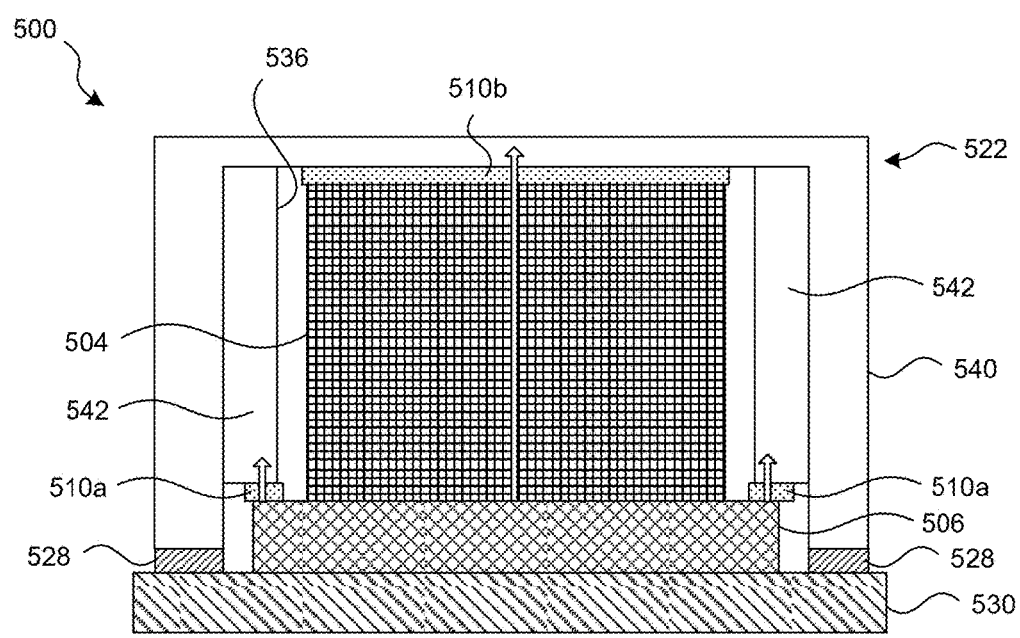
FIG. 5 is a partially schematic cross-sectional view of a semiconductor die assembly configured in accordance with still further embodiments of the present technology.

FIG. 5 is a partially schematic cross-sectional view of a semiconductor die assembly 500 ("assembly 500") configured in accordance with still further embodiments of the present technology. The assembly 500 can include features generally similar to the features of the assembly 400 described above with reference to FIG. 4. For example, the assembly 500 can include a thermally conductive casing 522 ("casing 522") having a cavity 536 that receives a die stack 504 and a second semiconductor die 506. The casing 522 can thermally contact a first thermal transfer feature 510a at a peripheral portion 508 of the second semiconductor die 506 and a second thermal transfer feature 510b at an upper portion of a die stack 504. The cavity 536 can also be configured to position the casing 522 proximate to the second semiconductor die 506 at a package substrate 530 to decrease the overall size of the package.

Rather than an integrally formed casing, the casing 522 illustrated in FIG. 5 includes an outer portion 540 and one or more thermally conductive members 542 positioned within the cavity 536 of the outer portion 540. The outer portion 540 can extend around the die stack 504 and the second semiconductor die 506 such that it thermally couples to the top of the stack 504 (e.g., via the second thermal transfer feature 510b) and the underlying package substrate 530 (e.g., via a thermally transmissive adhesive 528). The conductive members 542 can be pillars, cylinders, rectangular prisms, and/or other suitable structures spaced between the outer portion 540 and the first thermal transfer feature 510a to direct thermal energy away from the peripheral portion 508 of the second semiconductor die 506. During manufacture, the outer portion 540 can be designed to have a generally standard shape and/or size, whereas the thermally conductive members 542 can be configured to adapt the standard outer portion 540 to a specific configuration of the stacked dies 504, 506. As such, the casing 522 shown in FIG. 5 can simplify manufacturing and provide a cavity 536 that closely fits the stack of semiconductor dies 504, 506 to enhance heat transfer from the dies 504, 506.

Figure 6:
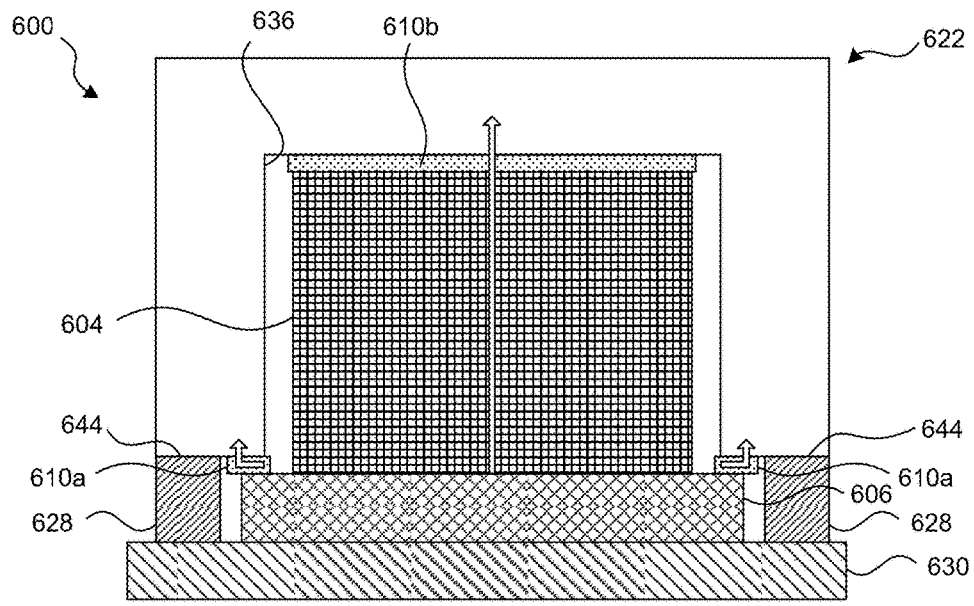
FIG. 6 is a partially schematic cross-sectional view of a semiconductor die assembly configured in accordance with additional embodiments of the present technology.

FIG. 6 is a partially schematic cross-sectional view of a semiconductor die assembly 600 ("assembly 600") configured in accordance with additional embodiments of the present technology. The assembly 600 can include features generally similar to the features of the assemblies 400 and 500 described above with reference to FIGS. 4 and 5. For example, the assembly 600 can include a package substrate 630, a stack 604 of first semiconductor dies (shown schematically), a second semiconductor die 606, and a thermally conductive casing 622 ("casing 622") having a cavity 636 configured to receive the stack 604. However, in the embodiment illustrated in FIG. 6, the casing 622 terminates a distance from the package substrate 630 such that a base portion 644 of the casing 622 can overlap a peripheral portion 608 of the second semiconductor die 606. An adhesive 628 and/or other underfill material can be used to attach the casing 622 to the underlying package substrate 630. As shown in FIG. 6, the casing 622 can thermally contact a first thermal transfer feature 610a at the peripheral portion 608 of the second semiconductor die 606 and a second thermal transfer feature 610b at the top of the die stack 604 to provide separate thermal paths (as indicated by the arrows) through which heat can be absorbed and spread through the casing 622. The casing 622 can therefore have a substantially standardized cavity shape around the stack 604, but still provide thermal contact proximate the peripheral portion 608 of the second semiconductor die 606 to facilitate heat dissipation from the second semiconductor die 606.

Figure 7:
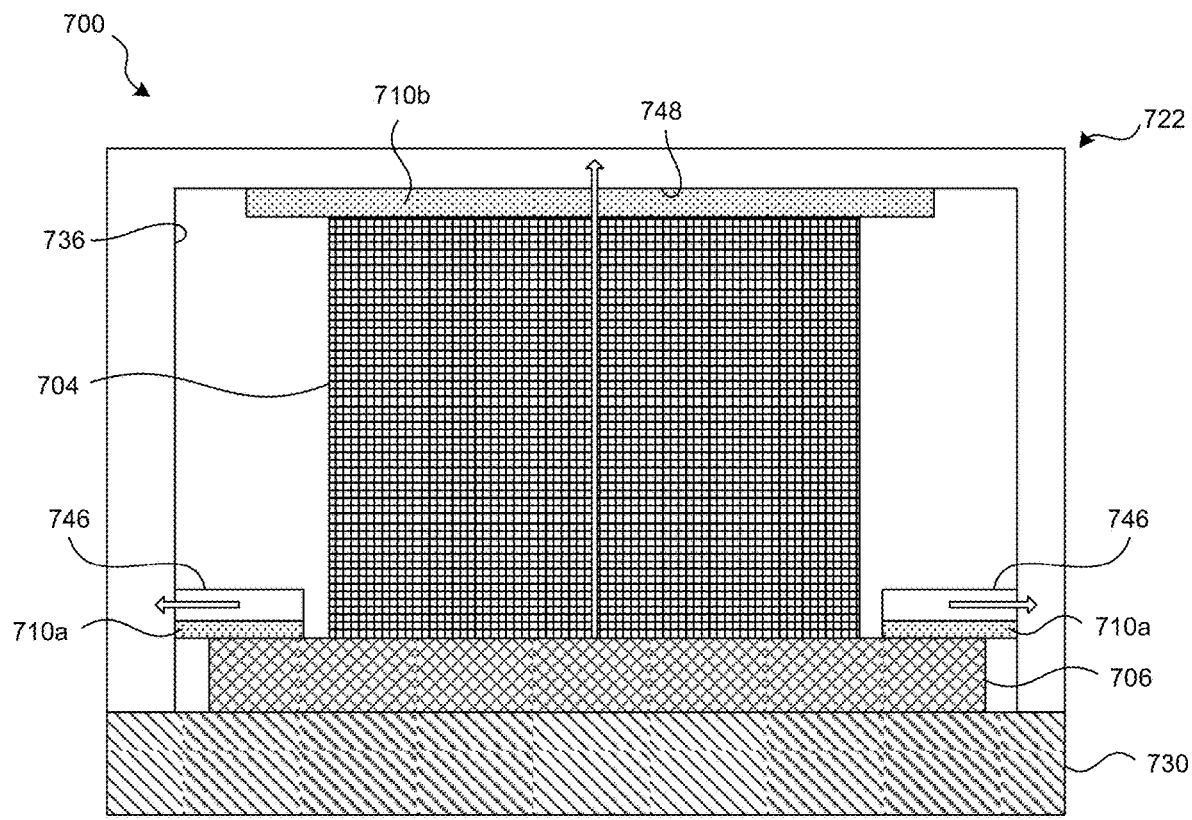
FIG. 7 is a partially schematic cross-sectional view of a semiconductor die assembly configured in accordance with other embodiments of the present technology.

FIG. 7 is a partially schematic cross-sectional view of a semiconductor die assembly 700 ("assembly 700") configured in accordance with other embodiments of the present technology. The assembly 700 can include features generally similar to the features of the assemblies 400, 500, 600 described above with reference to FIGS. 4-6, such as a stack 704 of first semiconductor dies (shown schematically) carried by a second semiconductor die 706 having a larger footprint than that of the stack 704. In the illustrated embodiment, the assembly 700 includes a thermally conductive casing 722 ("casing 722") having a cavity 736 and one or more flanges 746 extending laterally into the cavity 736. The flange 746 can be in thermal contact with a first thermal transfer feature 710a at a peripheral portion 708 of the second semiconductor die 706, and an underside 748 of the casing 722 can in thermal contact with a second thermal transfer feature 710b on the stack 704. The casing 722 therefore provides an increased thermal contact area with at least two separate thermal paths, one being directed laterally outward via the flanged portion 746 and another being directed vertically through the die stack 704 to the casing 722. As such, the assembly 700 can reduce the concentration of heat at the peripheral portion 708 of the second semiconductor die 706 and reduce the operating temperature of the second semiconductor die 706.

Figure 8:
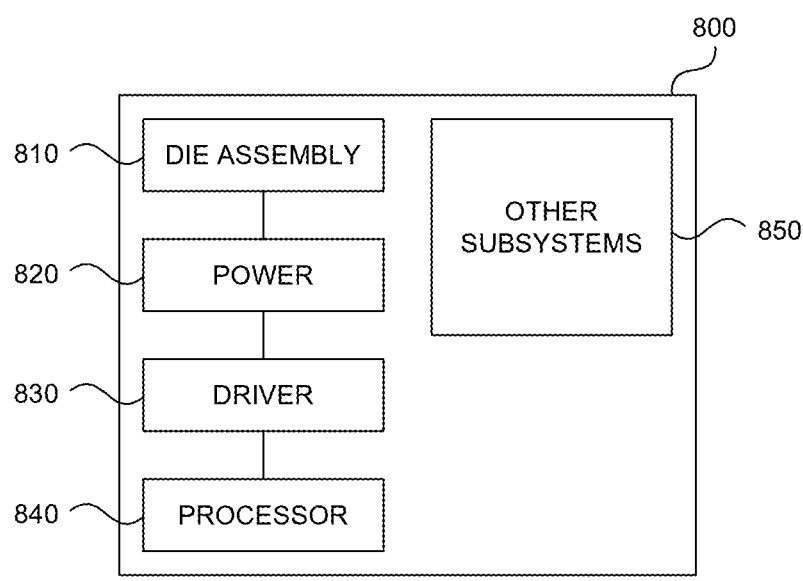
FIG. 8 is a schematic view of a system that includes a semiconductor e assembly configured in accordance with embodiments of the present technology.

Any one of the stacked semiconductor die assemblies described above with reference to FIGS. 1-7 can be incorporated into any of a myriad of larger and/or more complex systems, a representative example of which is system 800 shown schematically in FIG. 8. The system 800 can include a semiconductor die assembly 810, a power source 820, a driver 830, a processor 840, and/or other subsystems or components 850. The semiconductor die assembly 810 can include features generally similar to those of the stacked semiconductor die assemblies described above, and can therefore include multiple thermal paths that enhance heat dissipation. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, and appliances. Components of the system 800 may be housed in a single unit or distributed over multiple, interconnected units (e.g., through a communications network). The components of the system 800 can also include remote devices and any of a wide variety of computer readable media.

From the foregoing, it will be appreciated that specific embodiments of the technology have been described herein for purposes of illustration, but that various modifications may be made without deviating from the disclosure. For example, although many of the embodiments of the semiconductor dies assemblies are described with respect to HMGs, in other embodiments the semiconductor die assemblies can be configured as other memory devices or other types of stacked die assemblies. In addition, the semiconductor die assemblies illustrated in FIGS. 1-7 include a plurality of first semiconductor dies arranged in a stack on the second semiconductor die. In other embodiments, however, the semiconductor die assemblies can include one first semiconductor die stacked on the second semiconductor die. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:
1. A semiconductor die assembly, comprising:
   a stack of first semiconductor dies;
   a second semiconductor die carrying the stack of first semiconductor dies, wherein the second semiconductor die includes a peripheral portion extending laterally outward beyond at least one side of the stack of first semiconductor dies, and wherein the stack of first semiconductor dies defines a first thermal path that transfers heat away from the second semiconductor die;
   a plurality of thermally conductive elements extending from the stack of first semiconductor dies to the second semiconductor die, the thermally conductive elements being electrically isolated from the stack of first semiconductor dies and the second semiconductor die, wherein the first thermal path includes the plurality of thermally conductive elements;
   a thermal transfer feature at the peripheral portion of the second semiconductor die, wherein the thermal transfer feature defines a second thermal path that transfers heat away from the second semiconductor die, the second thermal path being separate from the first thermal path; and
   an underfill material disposed over the second semiconductor die, a first portion of the underfill material extending between the stack of first semiconductor dies and the second semiconductor die, a second portion of the underfill material adhering the thermal transfer feature to the peripheral portion of the second semiconductor die and extending therebetween, the underfill material extending form the first portion to the second portion;
   wherein the thermal transfer feature has a pillar structure extending vertically from second portion of the underfill material to an elevation generally corresponding to an uppermost die of the stack of first semiconductor dies.

2. The semiconductor die assembly of claim 1, further comprising:
   a plurality of electrically conductive elements disposed between the first and second semiconductor dies, the plurality of electrically conductive elements aligned with a plurality of through-silicon vias of the first semiconductor die, wherein the first thermal path includes the plurality of electrically conductive elements.

3. The semiconductor die assembly of claim 2, wherein:
the thermally conductive elements are positioned interstitially between the electrically conductive elements; and
the thermally conductive elements are not electrically coupled to the through-silicon vias.

4. The semiconductor die assembly of claim 2, wherein both the thermally conductive elements and the electrically conductive elements include pillars, columns, studs, bumps, or a combination thereof.

5. The semiconductor die assembly of claim 1, further comprising:
a thermally conductive casing in contact with the thermal transfer feature, wherein the thermally conductive casing extends at least partially around the first and second semiconductor dies.

6. The semiconductor die assembly of claim 5, wherein the thermally conductive casing includes a cavity configured to receive at least a portion of the first and second semiconductor dies.

7. The semiconductor die assembly of claim 1, wherein:
the stack of first semiconductor dies is a plurality of memory dies arranged in a stack, wherein the memory dies are electrically coupled to one another by a plurality of through-silicon vias included in each memory die and a first plurality of electrically conductive elements disposed between the memory dies, wherein individual electrically conductive elements of the first plurality of electrically conductive elements are aligned with corresponding through-silicon vias; and
the second semiconductor die is a logic die, wherein:
the stack including the plurality of memory dies is electrically coupled to the logic die by a second plurality of electrically conductive elements disposed between the stack and the logic die.

8. The semiconductor die assembly of claim 7, wherein the plurality of thermally conductive elements is a first plurality of thermally conductive elements, and wherein the stack comprising the plurality of memory dies further includes:
a second plurality of thermally conductive elements extending between the memory dies, the second plurality of thermally conductive elements positioned interstitially between the first plurality of electrically conductive elements, and electrically isolated from plurality of through-silicon vias, wherein the first thermal path has the stack with the second plurality of thermally conductive elements and the first plurality of electrically conductive elements.

9. The semiconductor die assembly of claim 1, wherein the second semiconductor die includes a plurality of through-silicon vias configured to electrically couple the second semiconductor die with higher level circuitry external to the second semiconductor die.

10. The semiconductor die assembly of claim 1, wherein the second semiconductor die is a logic die generating a first power density at the peripheral portion during operation, the first power density greater than a second power density that the logic die generates in a medial portion of the logic die.

11. A semiconductor die assembly, comprising:
a stack of first semiconductor dies;
a second semiconductor die carrying the stack of first semiconductor dies, wherein the second semiconductor die includes a peripheral portion extending laterally outward beyond at least one side of the stack of first semiconductor dies, and wherein the stack of first semiconductor dies defines a first thermal path that transfers heat away from the second semiconductor die;
a plurality of thermally conductive elements disposed between the stack of first semiconductor dies and the second semiconductor die and extending from the stack of first semiconductor dies to the second semiconductor die, the thermally conductive elements being electrically isolated from the stack of first semiconductor dies and the second semiconductor dies, wherein the first thermal path includes the plurality of thermally conductive elements;
a thermal transfer feature at the peripheral portion of the second semiconductor die, wherein the thermal transfer feature defines a second thermal path that transfers heat away from the second semiconductor die, the second thermal path being separate from the first thermal path;
a thermally conductive casing in contact with the thermal transfer feature, wherein the thermally conductive casing is in thermal communication with the thermal transfer feature; and
an underfill material disposed over the second semiconductor die, a first portion of the underfill material extending between the stack of first semiconductor dies and the second semiconductor die, a second portion of the underfill material adhering the thermal transfer feature to the peripheral portion of the second semiconductor die and extending therebetween, the underfill material extending form the first portion to the second portion;
wherein the thermal transfer feature has a pillar structure extending vertically from second portion of the underfill material to an elevation generally corresponding to an uppermost die of the stack of first semiconductor dies.

12. The semiconductor die assembly of claim 11, further comprising:
a plurality of electrically conductive elements disposed between the stack of first semiconductor dies and the second semiconductor die, the plurality of electrically conductive elements aligned with a plurality of through-silicon vias of a bottommost one of the first semiconductor dies of the stack, wherein the first thermal path includes the plurality of electrically conductive elements.

13. The semiconductor die assembly of claim 12, wherein:
the thermally conductive elements are positioned interstitially between the electrically conductive elements; and
the thermally conductive elements are electrically isolated from the through-silicon vias.

14. The semiconductor die assembly of claim 11, wherein:
the thermal transfer feature extends vertically to an elevation generally corresponding to that of a topmost one of the first semiconductor dies of the stack; and
the thermally conductive casing includes an outer portion attached to a package substrate carrying the second semiconductor die, the outer portion in thermal contact with a vertical sidewall of the thermal transfer feature.

15. The semiconductor die assembly of claim 11, wherein the thermally conductive casing includes:
an outer portion attached to a package substrate carrying the second semiconductor die, the outer portion defining a cavity configured to receive the stack of first semiconductor dies and the second semiconductor die; and at least one thermally conductive member positioned within the cavity in contact with the outer portion, the at least one thermally conductive member configured to thermally contact the thermal transfer feature and to adapt the cavity based on a vertical profile of the stack of first semiconductor dies and the second semiconductor die.

\* \* \* \* \*